United States Patent
Oh (10) Patent No.: US 10,121,902 B2
(45) Date of Patent: Nov. 6, 2018

(54) SEMICONDUCTOR INTEGRATED CIRCUIT DEVICE INCLUDING NANO-WIRE SELECTOR AND METHOD OF MANUFACTURING THE SAME

(71) Applicant: SK hynix Inc., Gyeonggi-do (KR)

(72) Inventor: Dong Yean Oh, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 9 days.

(21) Appl. No.: 15/371,358

(22) Filed: Dec. 7, 2016

(65) Prior Publication Data
US 2018/0061996 A1  Mar. 1, 2018

(30) Foreign Application Priority Data

Aug. 26, 2016 (KR) .................. 10-2016-0108888

(51) Int. Cl.
| | | |
|---|---|---|
| H01L 29/06 | (2006.01) | |
| H01L 29/786 | (2006.01) | |
| H01L 21/268 | (2006.01) | |
| H01L 21/28 | (2006.01) | |
| H01L 21/30 | (2006.01) | |
| H01L 29/10 | (2006.01) | |
| H01L 29/167 | (2006.01) | |
| H01L 29/423 | (2006.01) | |
| H01L 29/49 | (2006.01) | |
| H01L 29/66 | (2006.01) | |

(52) U.S. Cl.
CPC ...... *H01L 29/78696* (2013.01); *H01L 21/268* (2013.01); *H01L 21/28105* (2013.01); *H01L 21/3003* (2013.01); *H01L 29/0673* (2013.01); *H01L 29/1041* (2013.01); *H01L 29/167* (2013.01); *H01L 29/42392* (2013.01); *H01L 29/4983* (2013.01); *H01L 29/66742* (2013.01); *H01L 29/78618* (2013.01)

(58) Field of Classification Search
CPC ............ H01L 21/4882; H01L 29/7787; H01L 29/2003; H01L 23/3732; H01L 29/66462; H01L 29/78696; H01L 29/167; H01L 21/3003; H01L 29/0673; H01L 29/1041; H01L 21/28105; H01L 29/42392; H01L 29/4983; H01L 29/66742; H01L 29/78618; H01L 21/268
See application file for complete search history.

(56) References Cited

U.S. PATENT DOCUMENTS

| | | | | |
|---|---|---|---|---|
| 7,902,541 | B2 * | 3/2011 | Sekaric | .......... B82Y 10/00 257/12 |
| 9,263,260 | B1 * | 2/2016 | Basu | .......... H01L 21/0259 |
| 9,287,360 | B1 * | 3/2016 | Basu | .......... H01L 29/0673 |
| 9,559,164 | B2 * | 1/2017 | Feng | .......... H01L 21/02603 |
| 9,653,290 | B2 * | 5/2017 | Feng | .......... H01L 21/02603 |

(Continued)

*Primary Examiner* — Latanya N Crawford
(74) *Attorney, Agent, or Firm* — IP & T Group LLP (57) ABSTRACT

In a method of manufacturing a semiconductor integrated circuit device, an active region including a nano-wire may be formed on a bulk insulating layer. A hard mask pattern may be formed to partially expose the nano-wire. A work function-controlling region may be formed on the nano-wire exposed through the hard mask pattern. The hard mask pattern may be removed. A gate insulating layer may be formed on the nano-wire. A gate may be formed to surround the nano-wire.

14 Claims, 12 Drawing Sheets

(56) References Cited

U.S. PATENT DOCUMENTS

| | | | |
|---|---|---|---|
| 2005/0035342 A1* | 2/2005 | Chen | H01L 27/2436 257/2 |
| 2010/0123198 A1* | 5/2010 | Kim | H01L 21/26506 257/377 |
| 2010/0252801 A1* | 10/2010 | Sekaric | B82Y 10/00 257/9 |
| 2012/0007051 A1* | 1/2012 | Bangsaruntip | B82Y 10/00 257/24 |
| 2012/0326125 A1 | 12/2012 | Guo et al. | |
| 2014/0239247 A1 | 8/2014 | Park | |
| 2016/0300886 A1* | 10/2016 | Oh | H01L 27/2454 |
| 2017/0040465 A1* | 2/2017 | Yang | H01L 29/78684 |

* cited by examiner

SEMICONDUCTOR INTEGRATED CIRCUIT DEVICE INCLUDING NANO-WIRE SELECTOR AND METHOD OF MANUFACTURING THE SAME

CROSS-REFERENCES TO RELATED APPLICATION

The present application claims priority under 35 U.S.C. § 119(a) to Korean patent application number 10-2016-0108888, filed on Aug. 26, 2016, in the Korean Intellectual Property Office, which is incorporated herein by reference in its entirety.

BACKGROUND

1. Technical Field

Various embodiments generally relate to a semiconductor integrated circuit device and a method of manufacturing the same, and more particularly, to a semiconductor integrated circuit device including a nano-wire selector and a method of manufacturing the same.

2. Related Art

High integration memory devices typically employ a high capacity access element. The access element may be a selector such as a metal-oxide-semiconductor (MOS) transistor. High capacity, high integration MOS transistors having various structures are well known.

More recently, high integrity MOS selector transistors having a nano-wire channel have been developed. The nano-wire channel is advantageous because it enhances the integration degree of the selector. However, because the nano-wire channel is typically formed to float in the air between the drain and the source regions of the selector, the nano-wire channel may cause an increased leakage current. Hence, an improved selector capable of decreasing the leakage current is desirable.

SUMMARY

According to an embodiment, there may be provided a method of manufacturing a semiconductor integrated circuit device. In the method of manufacturing the semiconductor integrated circuit device, an active region including a nano-wire may be formed on a bulk insulating layer. A hard mask pattern may be formed to partially expose the nano-wire. A work function-controlling region may be formed on the nano-wire exposed through the hard mask pattern. The hard mask pattern may be removed. A gate insulating layer may be formed on the nano-wire. A gate may be formed to surround the nano-wire.

According to an embodiment, there may be provided a method of manufacturing a semiconductor integrated circuit device. In the method of manufacturing the semiconductor integrated circuit device, an active region including a nano-wire may be formed on a bulk insulating layer. A gate insulating layer may be formed on the nano-wire. A conductive layer having a first work function may be formed on the bulk insulating layer. The conductive layer having the first work function may be anisotropically etched to form a first gate configured to partially surround a channel region of the nano-wire. A conductive layer having a second work function may be formed on the nano-wire. The conductive layer having the second work function may be anisotropically etched to form a second gate at both sides of the first gate. The second gate may have a work function lower than that of the first gate.

BRIEF DESCRIPTION OF THE DRAWINGS

The above and other features and advantages of the present invention will become more apparent to those skilled in the art to which the present invention belongs by describing in detail various embodiments thereof with reference to the attached drawings in which.

DETAILED DESCRIPTION

Various exemplary embodiments of the present invention will be described hereinafter with reference to the accompanying drawings. The embodiments may, however, be embodied in many different forms and should not be construed as limited to the embodiments set forth herein. Rather, these embodiments are provided so that this disclosure will be thorough and complete, and will fully convey the present invention to those skilled in the art to which the present invention pertains. In the drawings, the sizes and relative sizes of layers and regions may be exaggerated for clarity.

It will be understood that when an element or layer is referred to as being n, "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region layer or section discussed below could be termed a second element, component, region, layer or section without departing from the teachings of the present disclosure.

Spatially relative terms, such as "under," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, it the device in the figures is turned over, elements described as "below" or "under" other elements or features would then be oriented "above" the other elements or features. Thus, the example of the term "below" can encompass both an orientation of above and below. The device may be otherwise oriented (rotated 90 degrees or at other orientations) and the spatially relative descriptors used herein interpreted accordingly.

The terminology used herein is for the purpose of describing particular examples of embodiments only and is not intended to be limiting of the present disclosure. As used herein, the singular forms "a," "an" and "the" are intended to include the plural forms as well, unless the context clearly indicates otherwise. It will be further understood that the terms "comprises/includes" and/or "comprising/including" when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs in view of the present disclosure. It will be further understood that terms, such as those defined in commonly used dictionaries, should be interpreted as having a meaning that is consistent with their meaning in the context of the relevant art and the present disclosure and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element (also referred to as a feature) described in connection with one embodiment may be used singly or in combination with other elements of another embodiment, unless specifically indicated otherwise.

Hereinafter, examples of the embodiments will be explained with reference to the accompanying drawings.

Figure 1:
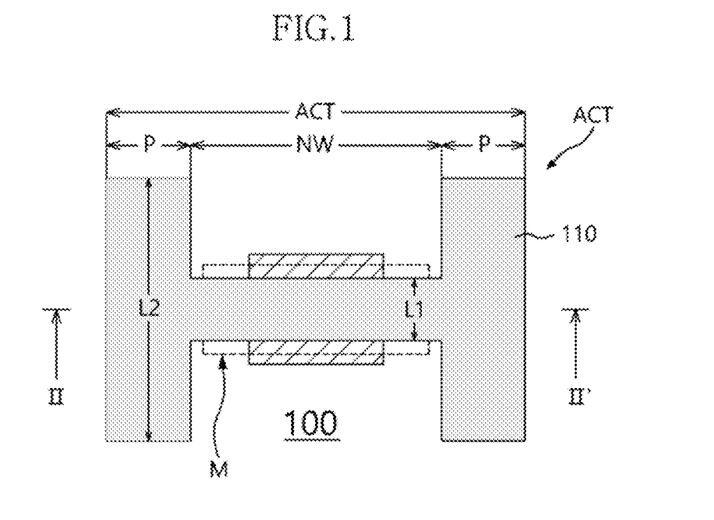
FIG. 1 is a plan view illustrating a semiconductor integrated circuit device, in accordance with an exemplary embodiment of the present invention.

FIG. 1 is a plan view illustrating a semiconductor integrated circuit device including a nano-wire selector in accordance with an exemplary embodiment of the present invention. FIGS. 2 to 9 are cross-sectional views illustrating a method of manufacturing a semiconductor integrated circuit device, in accordance with an exemplary embodiment of the present invention. FIGS. 2 to 9 are cross-sectional views taken along line II-II' of FIG. 1.

Figure 2:
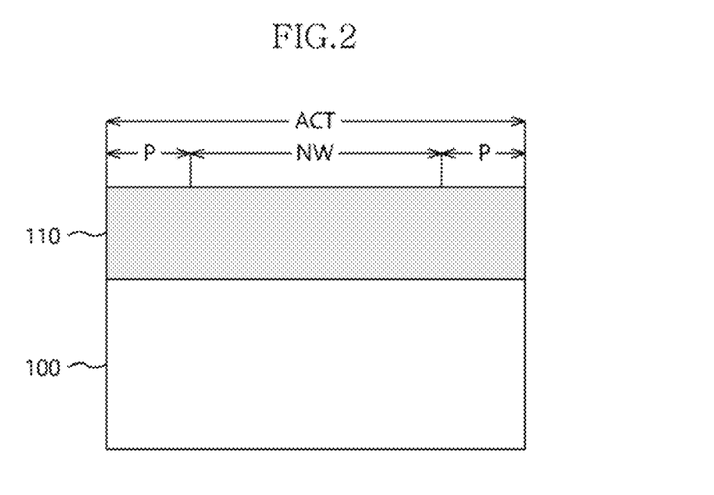
FIGS. 2 to 9 are cross-sectional views illustrating a method of manufacturing a semiconductor integrated circuit device, in accordance with an exemplary embodiment of the present invention.

Referring to FIGS. 1 and 2, a semiconductor layer 110 may be formed on an upper surface of a bulk insulating layer 100. The semiconductor layer 110 may include silicon. The semiconductor layer 110 may be patterned to define an active region ACT. The active region AC may include a nano-wire region NW and a pad region (for example, a contact pad region) P. The nano-wire region NW may be narrower than the pad region P, as shown in FIG. 1. More specifically, a dimension L1 of the nano-wire region NW may be smaller than the dimension L2 of the pad region P. A channel of a selector may be formed in the nano-wire region NW. The pad region P may be arranged at both sides of the nano-wire region NW forming together with the nano-wire region NW (when viewed from the top) a Greek upper case iota (I) shape. A source S and a drain D of the selector may be formed in the pad region P.

Figure 3:
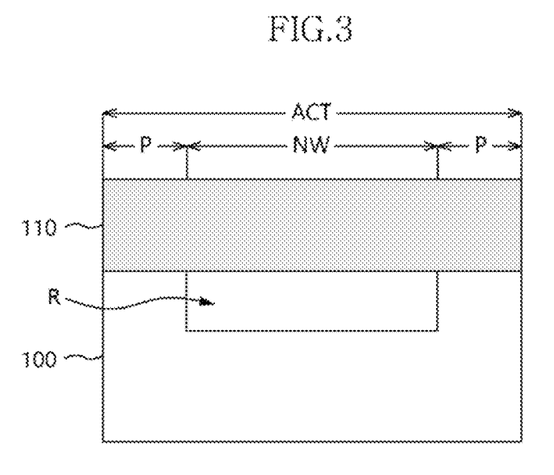

Referring to FIGS. 1 and 3, the bulk insulating layer 100 under the nano-wire region NW may be etched to form a groove R. The groove R may be formed using a mask pattern M. A mask pattern M (as shown in FIG. 1) may be formed to expose a peripheral region of the nano-wire region NW, i.e., the pad region P. The bulk insulating layer 100 may be isotropically etched using the mask pattern M to form the groove R. As shown in FIG. 3, the semiconductor layer 110 corresponding to the nano-wire region NW may be floated in the air by the groove R formed using the isotropic etching method.

Figure 4:
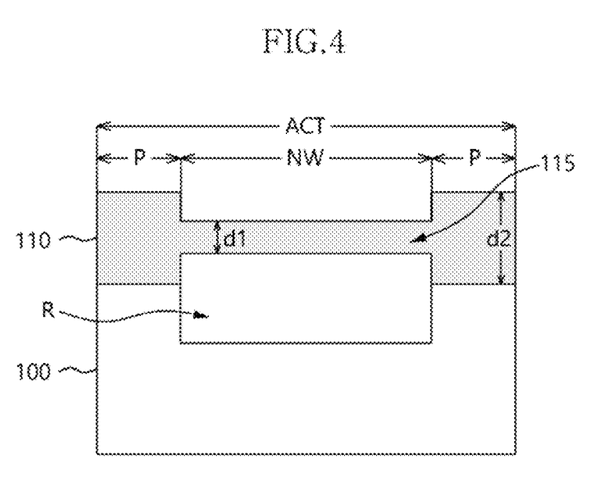

Referring to FIG. 4, the nano-wire region NW may be slimmed so that the semiconductor layer 110 corresponding to the nano-wire region NW may be partially removed to form an elongated slimmer nano-wire 115. The nano-wire region NW may be slimmed using, for example, an annealing process using hydrogen. The slimming process may be performed on all the surface of the nano-wire 115. Thus, a thickness d1 of the nano-wire 15 may become less thick than a thickness d2 of the pad region P.

Figure 5:
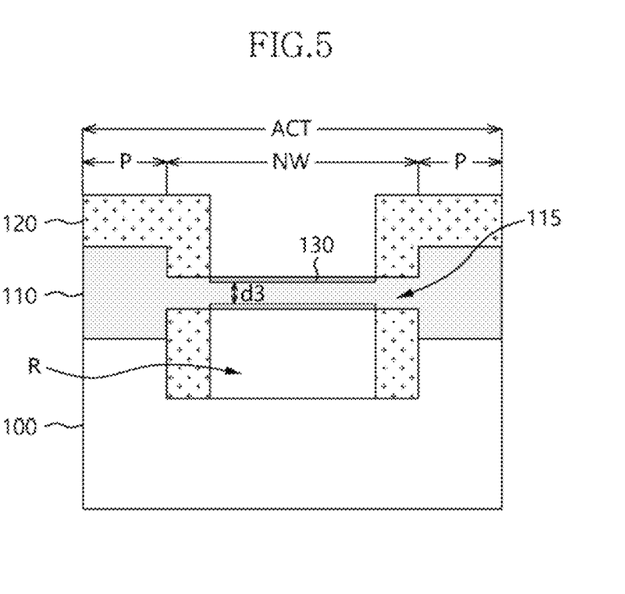

Referring to FIG. 5, a hard mask pattern 120 may be formed on the active region ACT and the bulk insulating layer 100 to expose a predetermined region of the nano-wire 115. The hard mask pattern 120 may be formed to expose the nano-wire 115 of the active region ACT corresponding to a channel region. The hard mask pattern 120 may include a material having an etching selectivity with respect to materials of the bulk insulating layer 100 and the semiconductor layer 110.

A work function-controlling region 130 may be formed on a surface of the nano-wire 115 exposed through the hard mask pattern 120. For example, the work function-controlling region 130 may be formed on the exposed surface of the nano-wire 115. The work function-controlling region 130 may be formed by doping a semiconductor material having a band gap different from that of the band gap of silicon in the nano-wire 115 to provide the work function-controlling region 130 with a junction region. The work function-controlling region 130 may be formed using a thin film deposition technique, such as, for example, a pulsed laser ablation deposition (PLAD) process. The work function-controlling region 130 may have a depth d3 which is less than a radius of the nano-wire 115 considered carrier mobility characteristic. Further, the depth d3 of the work function-controlling region 130 may have a thickness of about 5% to about 50% of the radius of the nano-wire 115 to prevent a decrease of the channel mobility.

A material of the work function-controlling region 130 may be changed in accordance with a conductive type of the selector, a conductive type of the semiconductor layer 110 constituting the active region ACT. For example, in an embodiment the selector may include an NMOS transistor, the semiconductor layer 110 may be silicon including N type impurities and the work function-controlling region 130 may include a semiconductor material having a band gap less than the band gap of the silicon such as, for example, SiGe, GaAs, InAs, GaSb, InSb, InP, MgS, MgSe, MaTe, ZnS, ZnSe, ZnTe, AlP, GaP, AlAs, AlSb, CdS, CdSe, and CdTe.

In another embodiment, the selector may include a PMOS transistor, i.e., the semiconductor layer 110 may be silicon including P type impurities, the work function-controlling region 130 may include a semiconductor material having a band gap greater than the band gap of the silicon such as, for example, SiC, AlN, GaN, ZnS, ZnO, ZnSe, CdS, BP, InN, and CdSe.

Thus, the work function-controlling region 130 can reduce an electric field concentration of the nano-wire to decrease a leakage current.

Figure 6:
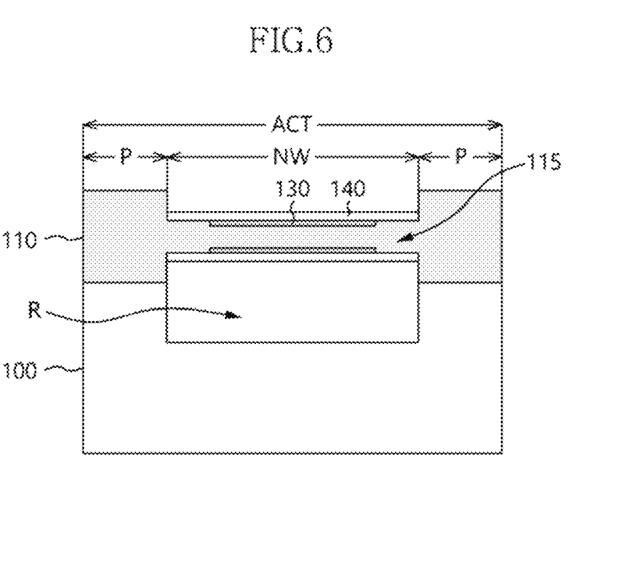

Referring to FIG. 6, the hard mask pattern 120 may then be removed. A gate insulating layer 140 may be formed on the surface of the nano-wire 115 to cover the work function-controlling region 130. The gate insulating layer 140 may also be formed on the active region ACT except for the pad region P. In order to prevent a formation of the gate insulating layer 140 on the pad region P, the gate insulating layer 140 may be formed using a mask pattern. Alternatively, after forming the gate insulating layer 140 on the entire active region ACT, the gate insulating layer 140 on the pad region P may be selectively removed.

Figure 7:
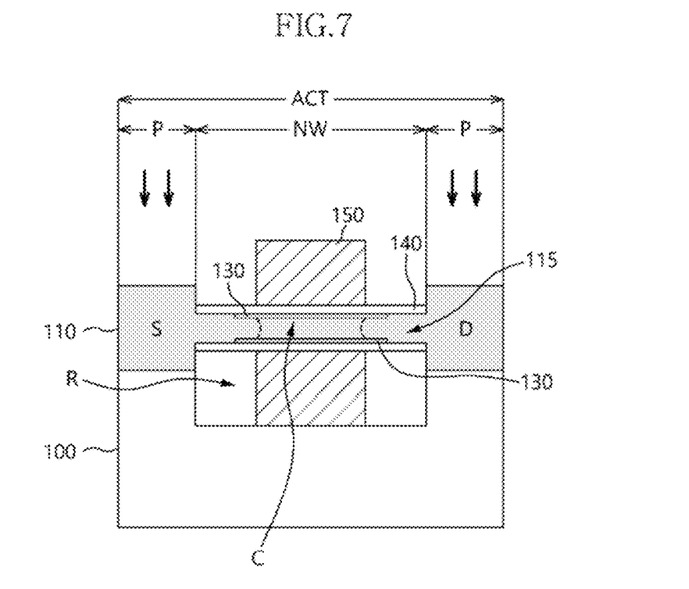

Referring to FIG. 7, a gate 150 may be formed over an outer surface of the gate insulating layer 140. In an exemplary embodiment of the present invention, a conductive layer (not shown) may be formed on the bulk insulating layer 100. The conductive layer may then be anisotropically etched to form the gate 150 which is configured to partially surround a central region of the gate insulating layer 140 that surrounds the nano-wire 115. Hence, part of the gate insulating layer 140 is not covered by the gate 150. The conductive layer may include, for example, W, Cu, TiN, TaN, WN, MoN, NbN, TiSiN, TiAlN, TiBN, ZrSiN, WSiN, WBN, ZrAlN, MoSiN, MoAlN, TaSiN, TaAlN, Ti, Mo, Ta, TiSi, TaSi, TiW, TiON, TiAlON, WON, TaON, and doped polysilicon.

A source S and a drain D may be formed in the pad regions of the active region ACT using an impurity ion implantation method. The source S is formed at one side of the channel region C of the nano-wire 115 and the drain D is formed at the other side of the channel region C of the nano-wire 115.

Figure 8:
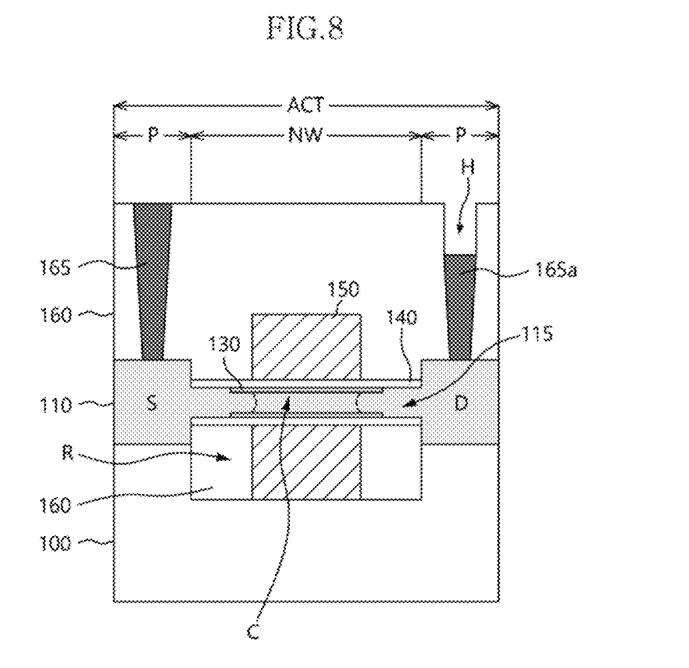

Referring to FIG. 8, an insulating interlayer 160 may be formed over the structure of FIG. 7 on the entire active region ACT and the bulk insulating layer 100. The insulating interlayer 160 may be etched to form contact holes (not shown) configured to expose a part of the top surface of the source S and the drain D. The contact hole is then filled with a conductive material to form contact plugs 165 and 165a (also referred to as wiring plugs) configured to make contact with the source S and the drain D.

Wiring plug 165a which is configured to make contact with the drain D may then be partially recessed to define a storage region H.

Figure 9:
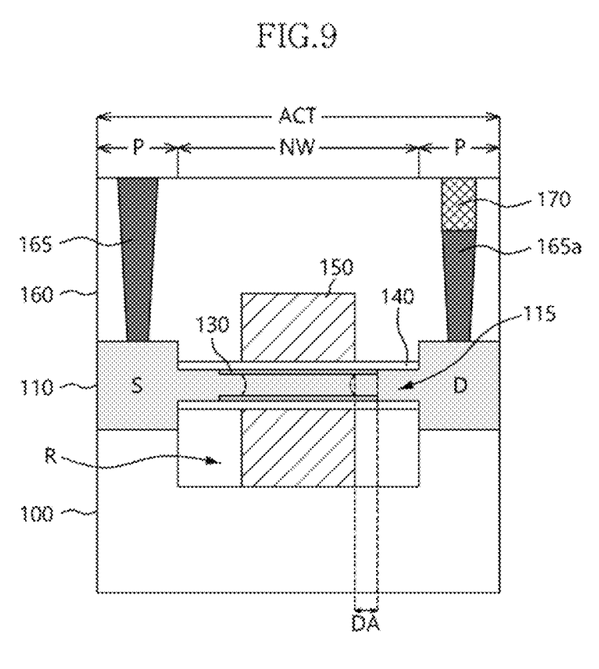

Referring to FIG. 9, a storage layer 170 may be formed in the storage region H. A material of the storage layer 170 may be selected in accordance with the kind of memory device. For example, in an embodiment, the memory device may be a dynamic random access memory (DRAM), and the storage layer 170 may be a storage capacitor. In another embodiment, the memory device may be a resistive RAM (ReRAM) and the storage layer 170 may be a PCMO($Pr_{1-x}Ca_xMnO_3$) layer. In yet another embodiment, the memory device may be a phase-change RAM (PCRAM) and the storage layer 170 may be a chalcogenide layer. In yet another embodiment, the memory device may be a magnetoresistive RAM (MRAM) and the storage layer 170 may be a magnetic layer. In yet another embodiment, the memory device may be a spin-transfer torque RAM (STTMRAM), and the storage layer 170 may be a magnetization reversal layer.

In an embodiment, where the storage layer 170 is a chalcogenide layer, the wiring plug 165 may correspond to a heating electrode. In this case, the wiring plugs 165 and 165a may include a conductive layer having a high specific resistance.

According to an exemplary embodiment of the present invention, the work function-controlling region 130 may be formed on the channel region to reduce or substantially prevent an electric field concentration between the drain to which a power voltage may be applied and the gate to which a selection voltage may be applied. Thus, the selector may have a single channel structure on which the electric field may be concentrated and in which the active region may be floated.

In more detail, when the nano-wire 115, including a semiconductor material, is doped with impurities for forming a junction region, a Fermi level of the nano-wire 115 may be increased due to the impurities. Thus, the doped semiconductor material, for example, an impurity doped silicon, may have a work function that is lower than a work function of silicon without an impurity.

If it weren't for the work function control region 130, in operation, when a power voltage V is applied to the drain D and a selection voltage is applied to the gate 150 to operate the MOS transistor, a high electric field may be concentrated on an edge portion of the gate 150 adjacent to the drain D. Further, since the gate insulating layer 140 is very thin, the electric field between the gate 150 and the drain D may be more concentrated to generate a gate induced drain leakage (GIDL). Forming the work function-controlling region 130 in the nano-wire 115 reduces or substantially prevents the generation of the GIDL. The nano-wire 115 may include a first semiconductor material. The work function-controlling region 130 may include a second semiconductor material having a band gap being different from a band gap of the first semiconductor material.

Figure 10:
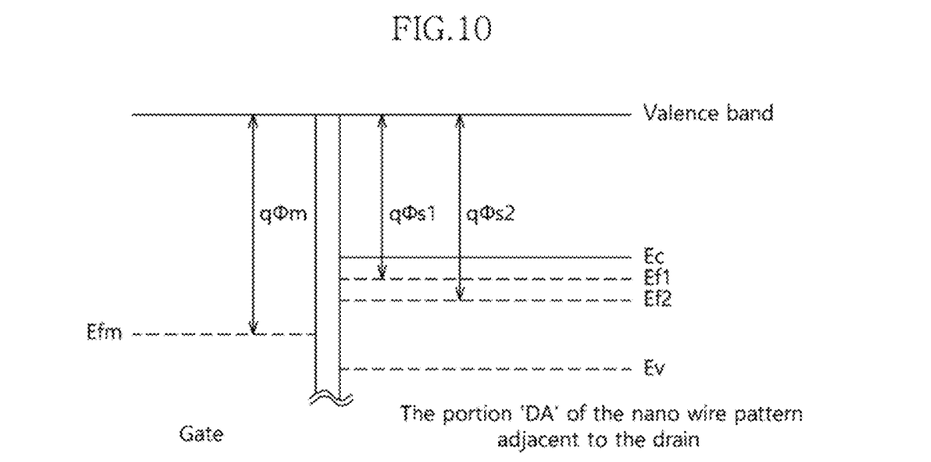
FIG. 10 is a diagram illustrating an energy band of a semiconductor integrated circuit device, in accordance with an exemplary embodiment of the present invention.

FIG. 10 is a diagram illustrating an energy band of a semiconductor integrated circuit device, in accordance with an embodiment of the present invention.

Referring to FIG. 10, the selector may include an NMOS transistor. The nano-wire 115 may include silicon. The work function-controlling region 130 may include silicon germanium. The portion DA of the nano-wire 115 which is adjacent to the drain D can be doped with an impurity and may have a Fermi level Ef1 substantially similar to a conductive band Ec of the silicon.

A constant voltage difference may be generated between a work function $q\Phi m$ of about 4.0 eV to about 5.0 eV of the gate 150 and a work function $q\Phi s1$ of the portion DA in the nano-wire 115. Because the portion DA of the nano-wire 115 may correspond to the work function of the silicon doped with an N+ type impurity, the leakage current may be generated due to the difference between the work function of the gate 150 and the work function of the nano-wire pattern 115.

In an embodiment, if the work function-controlling region 130 includes the second semiconductor material having a band gap greater than the band gap of the nano-wire 115, a Fermi level Ef2 of the portion DA in the nano-wire 115 may be decreased. As a result, the work function qΦs2 of the nano-wire 115 may be increased to reduce the difference between the work function of the nano-wire 115 and the work function qΦs of the gate 150, thereby reducing the GIDL. In FIG. 10, "Efm" refers to a Fermi level of the gate 150, and "Ev" refers to a valence band of the drain D, i.e., the silicon.

Figure 11:
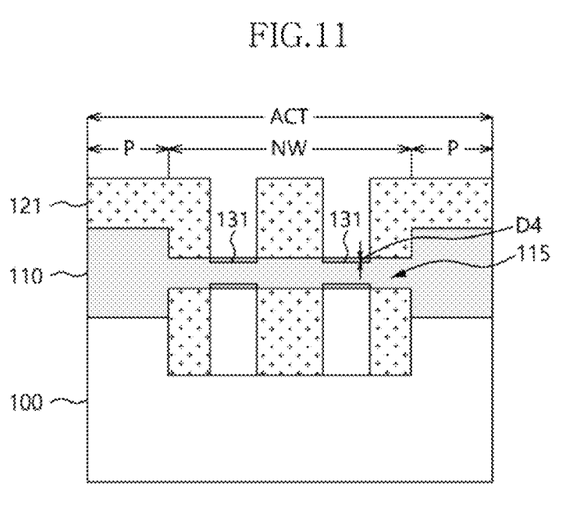
FIGS. 11 to 14 are cross-sectional views illustrating a method of manufacturing a semiconductor integrated circuit device, in accordance with an exemplary embodiment of the present invention.
Figure 12:
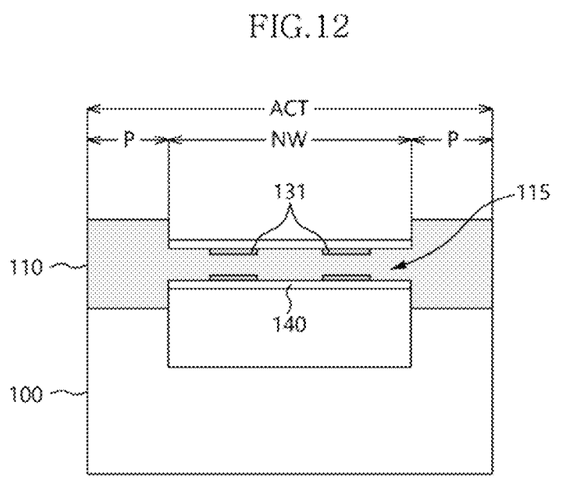
Figure 13:
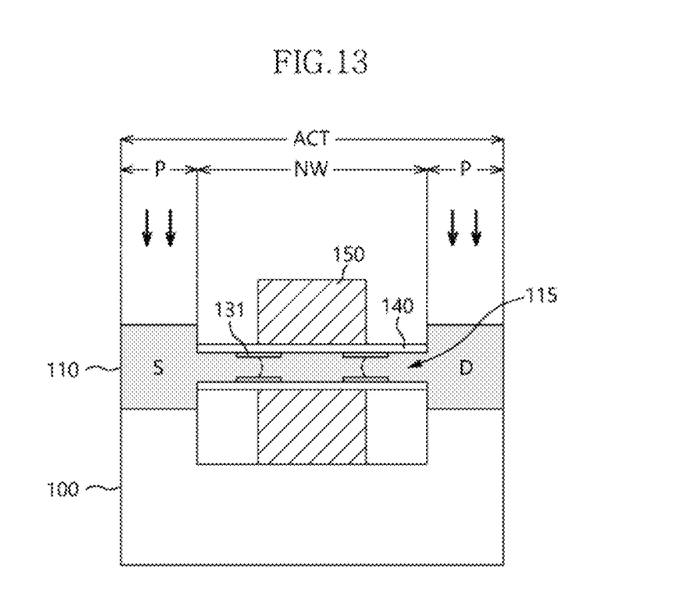

FIGS. 11 to 13 are cross-sectional views illustrating a method of manufacturing a semiconductor integrated circuit device, in accordance with an exemplary embodiment of the present invention.

The method of FIGS. 11 to 13 includes some processes which are substantially the same to those illustrated with reference to the embodiment of FIGS. 2 to 4 and which, for brevity, will not be described herein any further herein.

Referring to FIG. 11, a hard mask pattern 121 may be formed to expose a plurality of regions of the nano-wire 115. For example, portions of the nano-wire 115 in which edges of a gate may be positioned may be exposed through the hard mask pattern 121.

A work function-controlling region 131 may be formed on surfaces of the nano-wire 115 exposed through the hard mask pattern 121. For example, the work function-controlling region 131 may be formed to correspond to the edges of the gate using, for example, an ion implantation. The work function-controlling region 131 may include materials having various band gaps in accordance with types of the selector, i.e., kinds and impurity types of the active region ACT. The work function-controlling region 131 may have a junction region formed by employing a PLAD process. Further, the work function-controlling region 131 may have a depth d4 that is less than a radius of the nano-wire 115 considered carrier mobility characteristic. For example, the depth d4 of the work-function-controlling region 131 may have a thickness of about 5% to about 50% of the radius of the nano-wire 115 to prevent a decrease of the channel mobility. Since the work function-controlling region 131 is formed in the edges of the gate, the channel mobility is more improved, without a variation of a threshold voltage Vt of the selector.

Referring to FIG. 12, the hard mask pattern 121 may then be removed. A gate insulating layer 140 may be formed on the surfaces of the nano-wire 115 to cover the work function-controlling region 131. As shown in FIG. 12, the gate insulating layer 140 may be selectively formed to extend on the entire nano-wire 115. Alternatively, after forming the gate insulating layer 140 on the entire active region ACT, a portion of the gate insulating layer 140 on the pad region P may be removed leaving the gate insulating layer 140 on the nano-wire 115.

Referring to FIG. 13, a gate 150 may be formed to surround a central part of the gate insulating layer 140 so that an edge of the gate 150 may lie over the work function-controlling regions 131. Hence, the gate 150 partially overlaps with the work function-controlling regions 131. Impurities may be implanted into the nano-wire region NW and the pad region P at both sides of the gate 150 to form a source S and a drain D.

Processes for forming the insulating interlayer 160, contact plugs 165 and 165a and a storage layer 170 may then be performed as described above with regard to the same processes of FIGS. 8 and 9.

Figure 14:
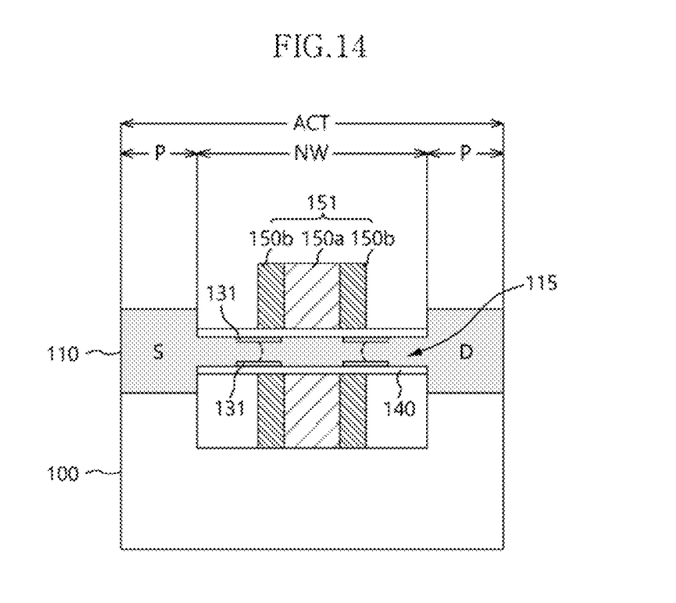

FIG. 14 is a cross-sectional view illustrating a semiconductor integrated circuit device in accordance with an exemplary embodiment of the present invention.

Referring to FIG. 14, a gate 151 may include a first gate 150a and second gates 150b having different work functions. More specifically, as illustrated in FIG. 14, the first gate 150a may be positioned centrally between the second gates 150b which are formed at either side of the first gate 150a.

In an exemplary embodiment of the present invention as illustrated in FIG. 14, the work function-controlling regions 131 are formed to extend partially below the gate 151 with a part extending beyond the edge of the gate 151 towards the source S and the drain D, respectively. The first gate 150a may be positioned between the work function-controlling regions 131. The second gates 150b may be positioned adjacent the sidewall of the first gate 150a.

The first gate 150a may include a conductive layer having a first work function. The second gates 150b may include a conductive layer having a second work function lower than the first work function. Since, the second gate 150b is positioned near to the source S and the drain D and the second gate 150b is also positioned near the work function-controlling region 131, the electric field concentration between the junction regions S and D and the gate may be stably mitigated.

In forming the gate 151, the conductive layer having the first work function may be formed on the bulk insulating layer 100 including the nano-wire 115. The conductive layer having the first work function may be anisotropically etched to form the first gate 150a configured to partially surround the channel region of the nano-wire 115. The conductive layer having the second work function may be formed on the nano-wire 115 with the first gate 150a. The conductive layer having the second work function may be anisotropically etched to form the second gates 150b positioned at both sides of the first gate 150a.

In an exemplary embodiment of the present invention, the first gate 150a may include a transition metal such as silicide. The second gates 150b may include a transition metal.

Figure 15:
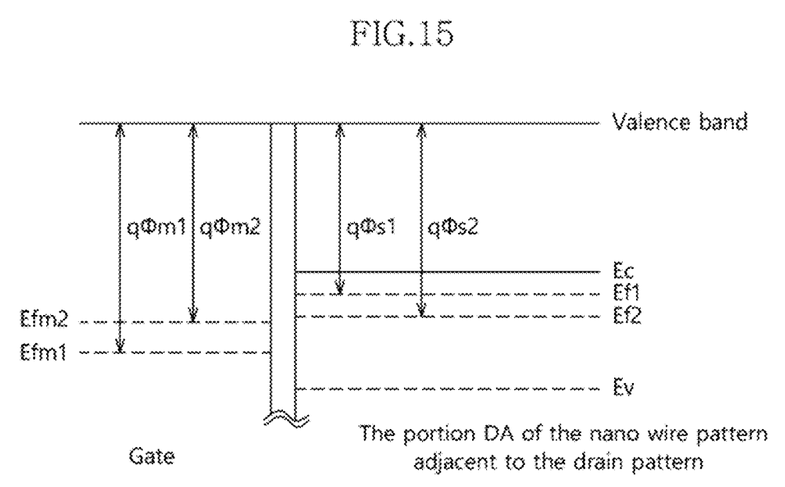
FIG. 15 is a diagram illustrating an energy band of a semiconductor integrated circuit device, in accordance with an exemplary embodiment of the present invention.

FIG. 15 is a diagram illustrating an energy band of a semiconductor integrated circuit device, in accordance with an exemplary embodiment of the present invention.

Referring to FIG. 15, the material of the second gates 150b which are formed at a region in which the electric field may be concentrated may have a second work function qΦm2 that is lower than a first work function qΦm1 of the material of the first gate 150a. Thus, the difference between the second work function qΦm2 of the second gates 150b and the work function qΦs2 of the portion DA in the nano-wire 115 may be reduced, thereby decreasing the GIDL. In FIG. 15, "qΦs1" refers to the work function of the nano-wire 115 (for example, the semiconductor layer 110).

Figure 16:
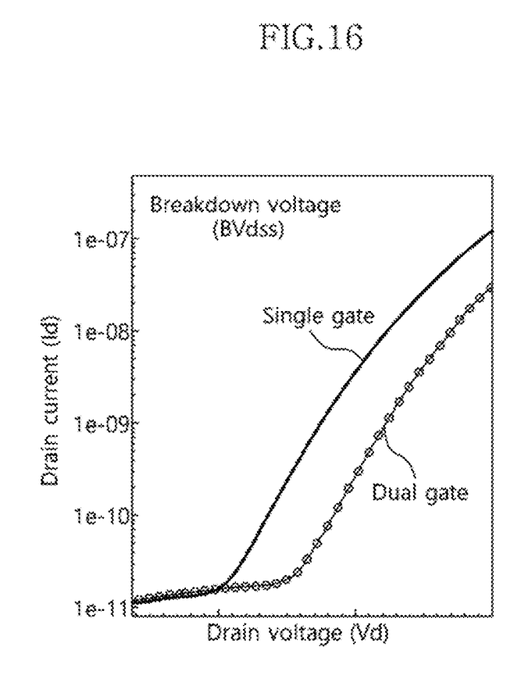
FIG. 16 is a diagram illustrating a leakage current characteristic of a semiconductor integrated circuit device, in accordance with an exemplary embodiment of the present invention.

FIG. 16 is a diagram illustrating a leakage current characteristic of a semiconductor integrated circuit device in accordance with an exemplary embodiment of the present invention.

Referring to FIG. 16, a breakdown voltage BVdss is applied to the drain D, a leakage current Id of a dual gate 151 having the first and second gates 150a and 150b is lower than that of a single gate 150.

Further, the gate 151 may be applied to embodiments before the work function-controlling region 130 may be formed on the entire channel region.

Figure 17:
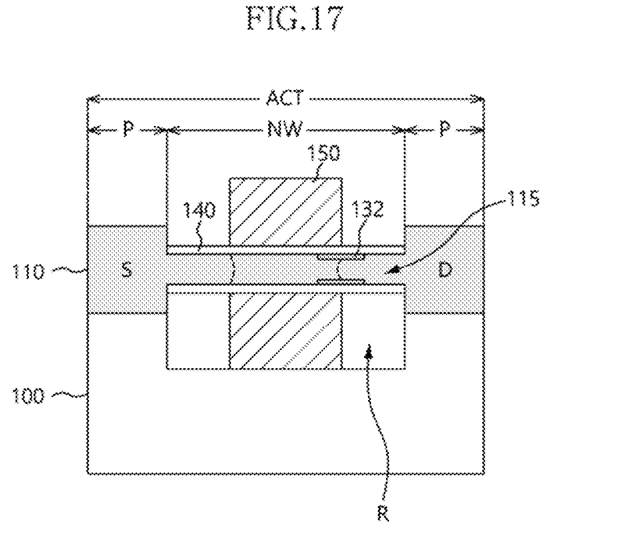
FIGS. 17 to 19 are cross-sectional views illustrating semiconductor integrated circuit devices, in accordance with an exemplary embodiment of the present invention.
Figure 18:
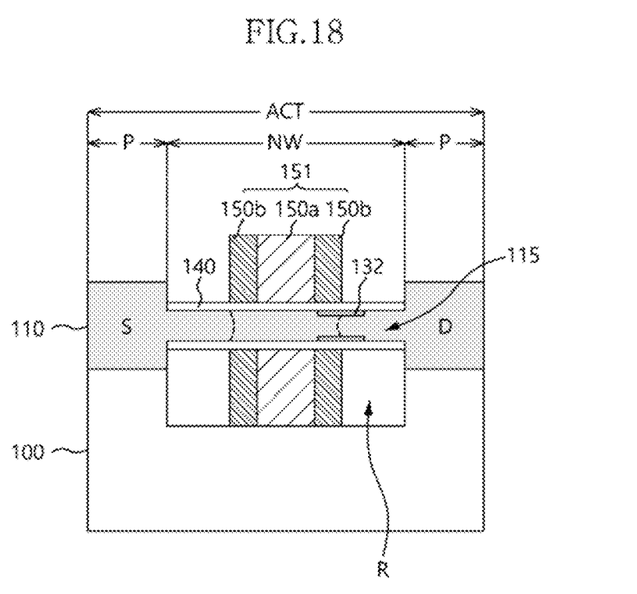
Figure 19:
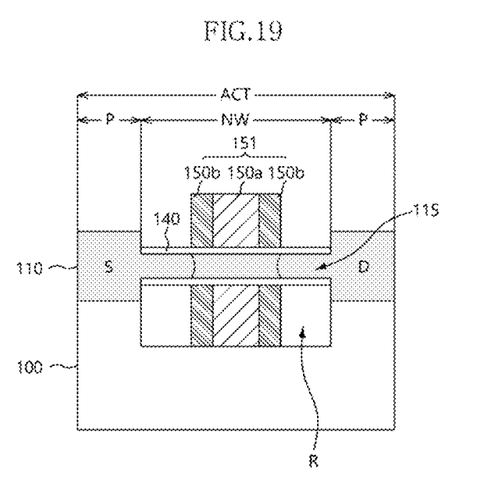

FIGS. 17 to 19 are cross-sectional views illustrating semiconductor integrated circuit device, in accordance with an exemplary embodiment of the present invention.

Referring to FIG. 17, a work function-controlling region 132 may be formed below the gate insulating layer 140 so that the edge of the gate 150 that is closer to the drain D is over an intermediate point of the work function-controlling region 132. In other words, the work function-controlling region 132 has one part that extends below and another part that extends beyond the edge of the gate 150 towards the drain D. The exact position of the work function-controlling region 132 may be changed in accordance with a position of the hard mask pattern 120 configured to expose the nano-wire 115.

Referring to FIG. 18, when the work function-controlling region 132 is formed near the drain D, a dual gate 151 having different work functions may be used. That is, the gate 151 may have a first gate 150a having a first work function and at least one second gate 150b having a second work function lower than the first work function. The second gate 150b may be formed at both sides of the first gate 150a. The second gate 150b may be formed on a sidewall of the first gate 150a positioned adjacent to the work function-controlling region 132.

Further, referring to FIG. 19, when a work function-controlling region is not formed, the second gate 150b which has a low work function may be formed at the edge of the gate 151 to reduce the electric field concentration between the gate and the junction region.

Figure 20:
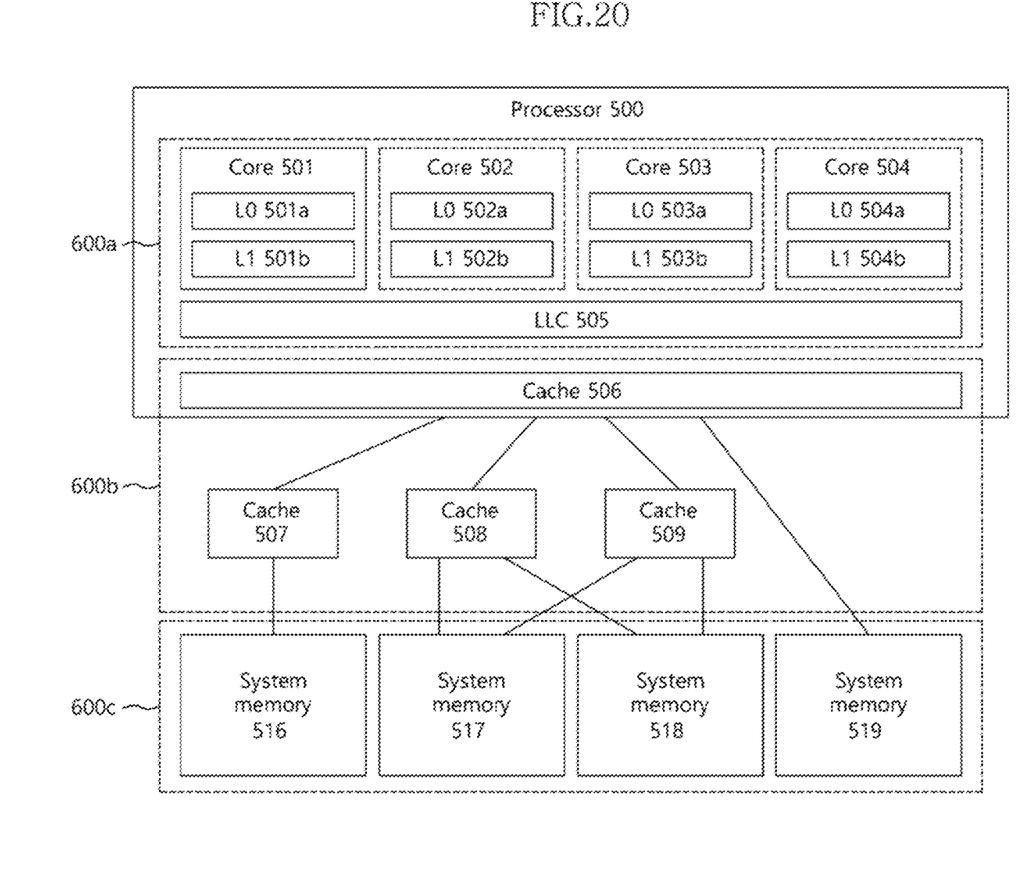
FIG. 20 is a block diagram illustrating a computer system, in accordance with an exemplary embodiment of the present invention.

FIG. 20 is a block diagram illustrating a computer system, in accordance with an exemplary embodiment of the present invention.

Referring to FIG. 20, a computer system may include a processor 500, a cache memory 507 to 509 and a plurality of system memories 516 to 519.

The processor 500 may include a plurality of cores 501 to 504. Each of the cores 501 to 504 may include upper level of caches L0: 501a to 504a and a middle level of caches L1: 501b to 504b. The upper level of the caches L0: 501a to 504a and the middle level of the caches L1: 501b to 504b may be dedicated to the corresponding cores 501 to 504.

The processor 500 may include lower level of caches LLC: 505 commonly shared with the cores 501 to 504. The processor 500 may further include a common cache 506 provided as a near memory.

A cache group may include a plurality of sub-caches 507 to 509. The cache group may be arranged between the processor 500 and the system memories 516 to 519. The sub-caches 507 to 509 may be operated to correspond to the system memories 516 to 519 divided by addresses. For example, the first sub-cache 507 may be used as a memory controller of the first system memory 516 corresponding to a first address section. The second sub-cache 508 may be used as a memory controller for controlling a non-over-lapped portion between the second system memory 517 and the third system memory 518 corresponding to a second address section.

The system memories 516 to 519 may include a memory configured to be directly accessed to software activated on the processor 500. In contrast, the caches 501a to 509 may be aided to activations of commands by the cores 501 to 504 under the activation of the software. The system memories 516 to 519 may be manually operated as a part of the processor and/or automatically operated by the software.

The system memories 516 to 519 may include a far memory and a near memory. The far memory and the near memory may include the nano-wire selector structure having the work function-controlling region.

The computer system may be interfaced with a dual in-line memory module (DIMM) as a storage device including the semiconductor integrated circuit device. The semiconductor integrated circuit device in the DIMM may include the nano-wire selector structure having the work function-controlling region.

The DIMM and the computer system may use a DRAM channel such as a DDR3, DDR4, DDR5, etc., as an interface. Reference numerals 600a, 600b and 600c may indicate a cache for an internal processor, a near memory operated as a remote memory cache, and a system memory, respectively.

The above embodiments of the present disclosure are illustrative and non-limiting. Various other alternatives and equivalents are possible. The described embodiments are not limited by the aforementioned description, nor is the present disclosure limited to any specific type of a semiconductor device. Many other additions, subtractions, or modifications which are obvious in view of the present disclosure may fall within the scope of the present invention as defined by the appended claims.

What is claimed is:

1. A method of manufacturing a semiconductor integrated circuit device, the method comprising:
    forming an active region including a nano-wire on a bulk insulating layer;
    forming a hard mask pattern configured to partially expose the nano-wire;
    forming a work function-controlling region on the nano-wire exposed through the hard mask pattern;
    removing the hard mask pattern;
    forming a gate insulating layer on the nano-wire;
    forming a gate configured to surround the nano-wire; and
    forming a source and a drain in the active region at both sides of the gate,
    wherein the hard mask pattern is formed on the bulk insulating layer to expose at least one region of the nano-wire corresponding to an edge of the gate, and
    wherein the work function-controlling region is formed to include a depth less than a radius of the nano-wire.

2. The method of claim 1, wherein forming the active region including the nano-wire comprises:
    forming a semiconductor layer on the bulk insulating layer;
    patterning the semiconductor layer to define pad regions and a nano-wire region, the nano-wire region extended from the pad regions and the nano-wire region having a width narrower than that of each of the pad regions;
    etching the bulk insulating layer corresponding to the nano-wire region to form a groove under the nano-wire; and
    slimming the semiconductor layer corresponding to the nano-wire region to form the nano-wire.

3. The method of claim 2, wherein etching the bulk insulating layer corresponding to the nano-wire region comprises isotropically etching the bulk insulating layer at a peripheral portion of the nano-wire region.

4. The method of claim 2, wherein slimming the semiconductor layer comprises annealing using hydrogen an upper surface of the nano-wire region and a surface of the nano-wire region exposed through the groove.

5. The method of claim 1, wherein the hard mask pattern is formed on the bulk insulating layer to expose a portion of the nano-wire overlapped with the gate and edges of the gate.

6. The method of claim 1, wherein the hard mask pattern is formed on the bulk insulating layer to expose a region positioned adjacent to the drain.

7. The method of claim 1, wherein forming the work function-controlling region comprises doping the nano-wire with a semiconductor material having a band gap different from a band gap of the nano-wire.

8. The method of claim 7, wherein when the nano-wire comprises an N type silicon, and
wherein the work function-controlling region comprises any one selected from the group consisting of SiGe, GaAs, InAs, GaSb, InSb, InP, MgS, MgSe, MaTe, ZnS, ZnSe, ZnTe, AlP, GaP, AlAs, AlSb, CdS, CdSe and CdTe.

9. The method of claim 7, wherein when the nano wire comprises a P type silicon, the work function-controlling region comprises any one selected from the group consisting of SiC, AlN, GaN, ZnS, ZnO, ZnSe, CdS, BP, InN and CdSe.

10. The method of claim 7, wherein the work function-controlling region is doped with the semiconductor material by a pulsed laser ablation deposition (PLAD) process.

11. The method of claim 1, wherein forming the gate comprises:
forming a conductive layer having a first work function on the bulk insulating layer with the nano-wire; and
anisotropically etching the conductive layer having the first work function to surround a channel region of the nano-wire.

12. The method of claim 1, wherein forming the gate comprises:
forming a first conductive layer having a first work function on the bulk insulating layer with the nano-wire;
anisotropically etching the first conductive layer having the first work function to form a first gate configured to surround a channel region of the nano-wire;
forming a second conductive layer having a second work function on a surface of the nano-wire with the first gate; and
anisotropically etching the second conductive layer having the second work function to form a second gate at both sides of the first gate,
wherein the second work function is lower than the first work function.

13. The method of claim 1, further comprising:
forming an insulating interlayer on the active region;
etching the insulating interlayer to form a contact hole configured to expose the source and the drain; and
forming a first contact plug contacted with the source and a second contact plug contacted with the drain.

14. The method of claim 13, further comprising:
recessing the second contact plug by a predetermined depth, to form a heating electrode; and
forming a storage layer on the heating electrode.

* * * * *